(12) United States Patent
Wu

(10) Patent No.: US 11,861,187 B2
(45) Date of Patent: Jan. 2, 2024

(54) METHOD AND DEVICE FOR DETERMINING MEMORY POWER CONSUMPTION, STORAGE MEDIUM AND ELECTRONIC DEVICE

(71) Applicant: CHANGXIN MEMORY TECHNOLOGIES, INC., Hefei (CN)

(72) Inventor: Yuyan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 64 days.

(21) Appl. No.: 17/840,932

(22) Filed: Jun. 15, 2022

(65) Prior Publication Data

US 2023/0214135 A1    Jul. 6, 2023

Related U.S. Application Data

(63) Continuation of application No. PCT/CN2022/080238, filed on Mar. 10, 2022.

(30) Foreign Application Priority Data

Jan. 6, 2022 (CN) .......................... 202210009824.X

(51) Int. Cl.
G06F 3/06 (2006.01)
(52) U.S. Cl.
CPC .......... G06F 3/0625 (2013.01); G06F 3/0653 (2013.01); G06F 3/0673 (2013.01)
(58) Field of Classification Search
CPC ..... G06F 3/0625; G06F 3/0653; G06F 3/0673
See application file for complete search history.

(56) References Cited

U.S. PATENT DOCUMENTS

2019/0042160 A1* 2/2019 Kumar .................. G04F 10/005
2021/0133549 A1* 5/2021 Wang ....................... G11C 7/16

FOREIGN PATENT DOCUMENTS

CN       101286185 A    10/2008
CN       108964656 A    12/2018

OTHER PUBLICATIONS

Yu, Shimeng, et al. "Compute-in-memory chips for deep learning: Recent trends and prospects." IEEE circuits and systems magazine 21.3 (2021): 31-56. (Year: 2021).*

(Continued)

*Primary Examiner* — Nicholas J Simonetti
(74) *Attorney, Agent, or Firm* — Cooper Legal Group, LLC

(57) ABSTRACT

A method for determining the memory power consumption includes: receiving a memory control command and controlling an analog memory to enter different working stages according to the memory control command (S410); acquiring an original current change curve of the analog memory in different working stages (S420); determining a target time period corresponding to a target working stage according to a time sequence of the memory control command (S430); intercepting a stage current change curve corresponding to the target working stage from the original current change curve according to the target time period to obtain a target current change curve (S440); selecting target performance parameters from a memory performance parameter table according to the target working stage (S450); and determining the power consumption of the memory according to the target performance parameters and the target current change curve (S460).

20 Claims, 5 Drawing Sheets

(56) References Cited

OTHER PUBLICATIONS

"CCS Power Technical White Paper", Version 3.0, Synopsys, Inc. 700 East Middlefield Road Mountain View, CA 94043 USA, Aug. 24, 2006, 20 pages.

* cited by examiner

METHOD AND DEVICE FOR DETERMINING MEMORY POWER CONSUMPTION, STORAGE MEDIUM AND ELECTRONIC DEVICE

CROSS-REFERENCE TO RELATED APPLICATION

This is a continuation of International Patent Application No. PCT/CN2022/080238, filed on Mar. 10, 2022, which claims priority to Chinese Patent Application No. 202210009824.X, filed on Jan. 6, 2022. The disclosures of International Patent Application No. PCT/CN2022/080238 and Chinese Patent Application No. 202210009824.X are hereby incorporated by reference in their entireties.

TECHNICAL FIELD

The disclosure relates to the technical field of integrated circuits, and in particular to a method and device for determining memory power consumption, a computer readable storage medium and an electronic device.

BACKGROUND

A Dynamic Random Access Memory (DRAM) is a commonly used semiconductor memory device in computers, has the advantages of simple structure, high density, low power consumption, low cost and so on, and is widely applied to the field of computers and the electronics industry.

Memory power consumption plays an important role in system performance Excessive memory power consumption may lead to system failure. Therefore, to ensure normal operation of a system, it is necessary to determine the memory power consumption for system failure analysis.

SUMMARY

According to an aspect of the disclosure, a method for determining memory power consumption is provided, which may include the following operations. A memory control command is received and an analog memory is controlled to enter different working stages according to the memory control command. An original current change curve of the analog memory in different working stages is acquired. A target time period corresponding to a target working stage is determined according to a time sequence of the memory control command A stage current change curve corresponding to the target working stage is intercepted from the original current change curve according to the target time period to obtain a target current change curve. Target performance parameters are selected from a memory performance parameter table according to the target working stage. The memory power consumption is determined according to the target performance parameters and the target current change curve.

According to an aspect of the disclosure, a device for determining memory power consumption is provided. In an exemplary implementation of the disclosure, the device may include a memory analog module, an original current acquisition module, a target time period determination module, a target current determination module, a target parameter determination module, a power consumption determination module. The memory analog module is configured to receive a memory control command and control an analog memory to enter different working stages according to the memory control command. The original current acquisition module is configured to acquire an original current change curve of the analog memory in different working stages. The target time period determination module is configured to determine a target time period corresponding to a target working stage according to a time sequence of the memory control command. The target current determination module is configured to intercept a stage current change curve corresponding to the target working stage from the original current change curve according to the target time period to obtain the target current change curve. The target parameter determination module is configured to select target performance parameters from a memory performance parameter table according to the target working stage. The power consumption determination module is configured to determine the memory power consumption according to the target performance parameters and the target current change curve.

According to an aspect of the disclosure, a computer readable storage medium is provided, on which a computer program is stored. The computer program is executed by a processor to implement the above method for determining the memory power consumption.

According to an aspect of the disclosure, an electronic device is provided, which may include a processor and a memory configured to store an executable instruction of the processor. The processor is configured to execute the executable instruction to execute the above method for determining the memory power consumption.

It is to be understood that the above general descriptions and detail descriptions below are merely exemplary and explanatory, which do not limit the disclosure.

BRIEF DESCRIPTION OF THE DRAWINGS

The drawings herein are incorporated into and constitute a part of the specification, which illustrate embodiments in accordance with the disclosure and together with the specification are used to explain the principle of the disclosure. It is apparent that the drawings in the following descriptions are only some embodiments of the disclosure. Those of ordinary skill in the art may also obtain other drawings in accordance with these drawings without creative work.

DETAILED DESCRIPTION

Figure 1:
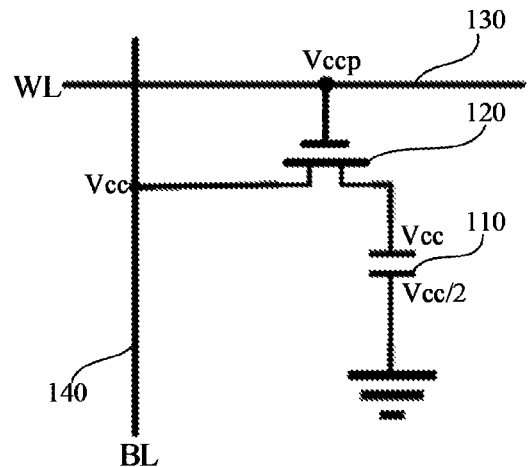
FIG. 1 schematically illustrates a schematic structural diagram of a storage unit according to an exemplary embodiment of the disclosure.

Exemplary embodiments will now be described more comprehensively with reference to the drawings. However, the exemplary embodiments may be implemented in various forms, and should not be understood to be limited to embodiments elaborated herein. Instead, these embodiments are provided to make the disclosure more comprehensive and complete and comprehensively communicate the concept of the exemplary embodiments to those skilled in the art. The same reference numerals in the drawings represent the same or similar structures, and thus the detailed description will be omitted.

Although relative terms, such as "upper" and "lower", are used in the specification to describe the relative relationship of one component to another component, these terms are used herein for convenience only, for example, according to the direction of the examples as illustrated in the drawings. It can be understood that if the device in the drawings is turned upside down, the components described as "upper" will become the "lower" components. When one structure is "on" the other structure, it is possible to indicate that the structure is integrally formed on the other structure, or the structure is "directly" disposed on the other structure, or the structure is "indirectly" disposed on the other structure by means of another structure.

The terms "a", "an", "the", and "said" are used to express the presence of one or more elements/parts/or the like. The terms "include" and "have" are used to be inclusive, and mean there may be additional elements/parts/or the like in addition to the listed elements/parts/or the like.

A semiconductor memory is used in computers, servers, handheld devices such as mobile phones, printers and many other electronic devices and applications. The semiconductor memory may include a plurality of storage units in a memory array, and each storage unit stores at least one bit of information. A Dynamic Random Access Memory (DRAM) is an example of the semiconductor memory. This scheme is preferably used in the DRAM. Therefore, the following embodiment descriptions are made with reference to the DRAM as a non-restrictive example.

In a DRAM integrated circuit device, the array of the storage units is typically arranged in rows and columns, so that a specific storage unit may be addressed by specifying the rows and columns of the array. A Word Line (WL) connects rows to a Bit Line (BL) Sense Amplifier (SA) of data in a set of detection units. Then, in the read operation, a data subset in the sense amplifier is selected or "column selected" for output.

Referring to FIG. 1, each storage unit 100 in the DRAM may usually include a capacitor 110, a transistor 120, a WL 130 and a BL 140. The gate of the transistor 120 is connected to the WL 130, the drain of the transistor 120 is connected to the BL 140, and the source of the transistor 120 is connected to the capacitor 110. A voltage signal on the WL 130 may control the transistor 120 to be turned on or off, so that the data information stored in the capacitor 110 is read through the BL 140, or the data information is written into the capacitor 110 through the BL 140 for storage.

Figure 2:
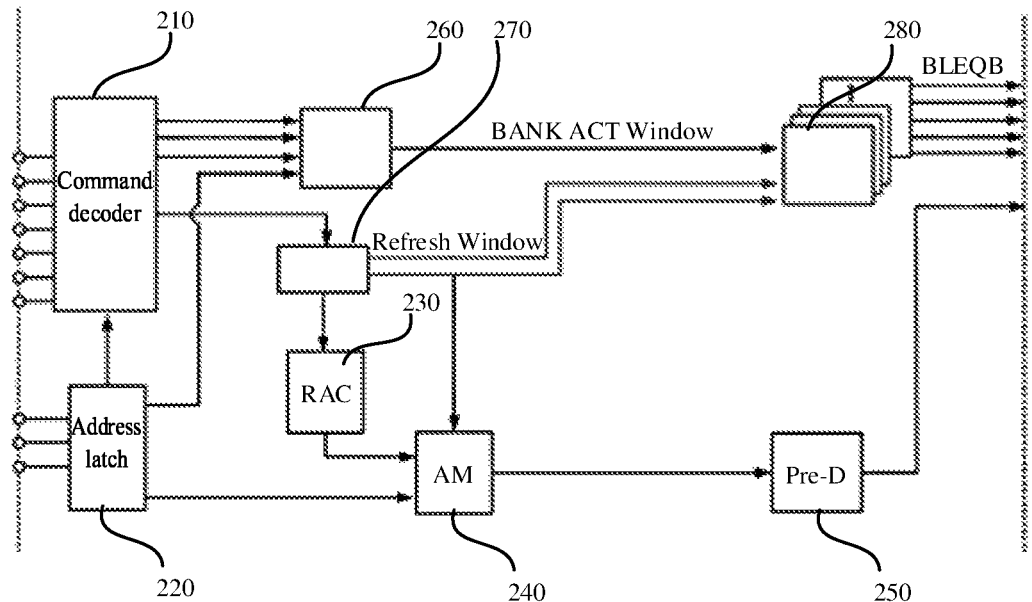
FIG. 2 schematically illustrates a schematic structural diagram of a peripheral circuit of a memory according to an exemplary embodiment of the disclosure.

A bank is composed of multiple storage units. The bank generally occupies 50-65% of the area of the whole DRAM device, and the rest of the area of the DRAM device is mainly composed of a peripheral circuit. FIG. 2 illustrates a schematic structural diagram of the peripheral circuit. As illustrated in FIG. 2, the peripheral circuit of the DRAM device may include a Command Decoder 210, an Address Latch 220, a Refresh Address Counter (RAC) 230, an Address MUX (AM) 240 and a Pre-Decoder (Pre-D) 250. The Command decoder 210 is configured to decode RESET_n, CKE, CK_t/CK_c, PAR, TEN, CS_n, ACT_N and other commands CMD issued by the system, and the Address Latch 220 is configured to temporarily store the address code A<16:0>.

In addition, the peripheral circuit of the DRAM device may also include: an activation window signal generation module 260, a refresh window signal generation module 270 and a control signal generation module 280. The activation window signal generation module 260 is configured to generate a bank activation window signal BANK ACT Window Signal, and the refresh window signal generation module 270 is configured to generate a refresh window signal Refresh Window Signal.

Figure 3:
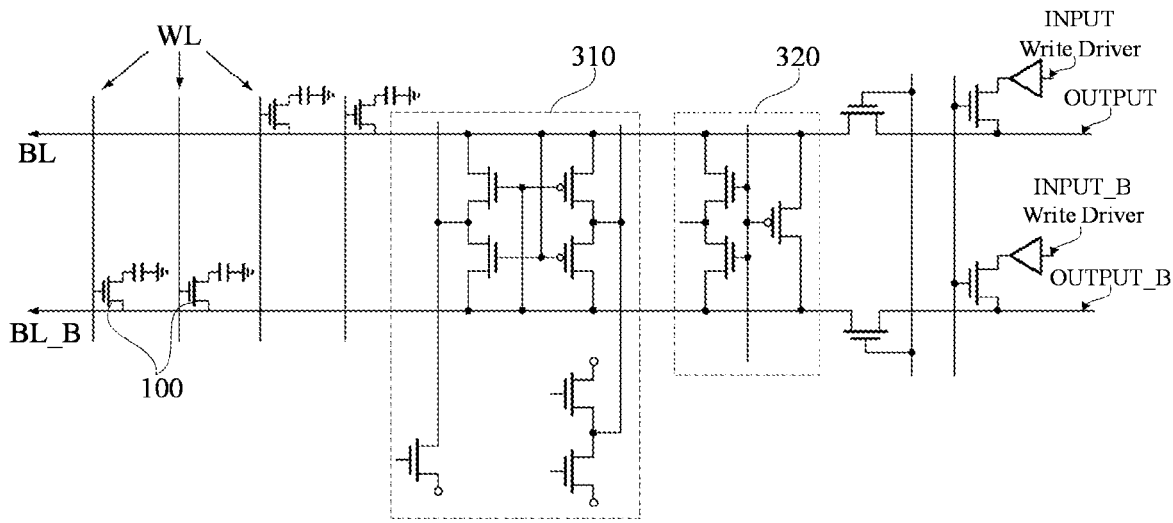
FIG. 3 schematically illustrates a schematic diagram of a bank in a memory according to an exemplary embodiment of the disclosure.

Referring to FIG. 3, a schematic structural diagram of a bank is illustrated. The bank 300 may include a BL, a complementary BL BL_B, a plurality of WLs and a plurality of storage units 100. The plurality of storage units 100 share the above BL or complementary BL BL_B. In addition, the BL and the complementary BL BL_B are also configured to access input write drivers INPUT Write Driver and INPUT_B Write driver, and to output output signals OUTPUT and OUTPUT_B.

In the exemplary implementation mode of the disclosure, the bank 300 may also include a sensing module 310 and a BL balancing module 320. The BL balancing module 320 is configured to conduct the BL and the complementary BL BL_B under the action of a BL balancing control signal BLEQ to close the read-write operation to the storage units 100.

Referring to FIG. 3, the sensing module 310 may mainly include the SA which may address the plurality of storage units 100 through the BL or BL_B. Specifically, a conventional sense amplifier is a differential amplifier, and the differential amplifier operates with the BL and the complementary BL BL_B serving as a reference line (as a reference line) to detect and amplify a voltage difference on a pair of BL and BL_B.

For a memory, there are usually many different working stages, such as a read operation stage, a write operation stage and a refresh operation stage. A complete read operation stage may include four different sub-stages: Precharge, Access, Sense and Restore. The write operation stage may include five different sub-stages: Precharge, Access, Sense, Restore and Write Recovery. The exemplary implementation mode of the disclosure does not describe the specific working stages of the memory in detail, which may refer to the existing memory.

Figure 4:
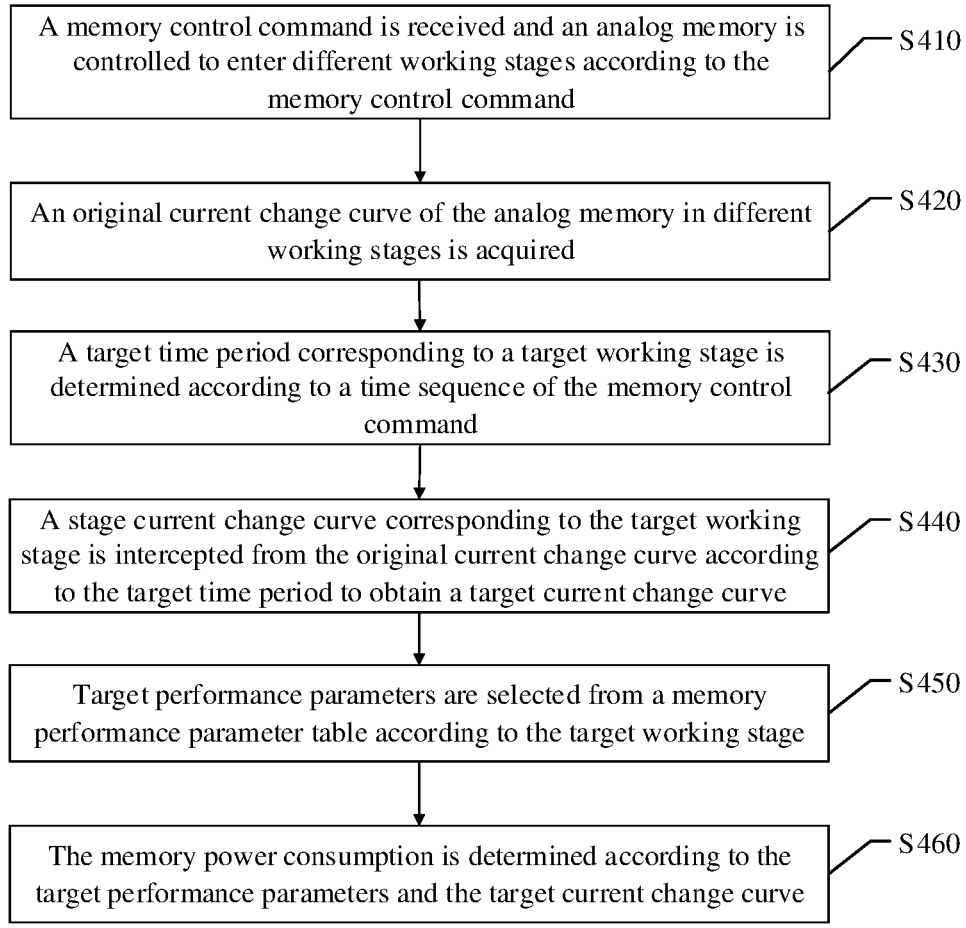
FIG. 4 schematically illustrates a flowchart of a method for determining memory power consumption according to an exemplary embodiment of the disclosure.

Referring to FIG. 4, a method for determining memory power consumption provided by the exemplary implementation mode of the disclosure may include the following operations.

At S410, a memory control command is received and an analog memory is controlled to enter different working stages according to the memory control command.

At S420, an original current change curve of the analog memory in different working stages is acquired.

At S430, a target time period corresponding to a target working stage is determined according to a time sequence of the memory control command.

At S440, a stage current change curve corresponding to the target working stage is intercepted from the original current change curve according to the target time period to obtain a target current change curve.

At S450, target performance parameters are selected from a memory performance parameter table according to the target working stage.

At S460, the memory power consumption is determined according to the target performance parameters and the target current change curve.

In the method for determining memory power consumption provided by an exemplary implementation mode of the disclosure, on the one hand, the analog memory is controlled to enter different working stages, so that the original current change curve of the analog memory in different working stages may be easily acquired as the original current change curve of the memory for subsequent power consumption determination. On the other hand, after the target working stage is determined, the stage current change curve corresponding to the target working stage may be intercepted according to the corresponding target time period, the target current change curve may be obtained based on the stage current change curve, and finally, the memory power consumption may be determined in combination with the target current change curve and the target performance parameters. The determined memory power consumption may be used as the actual power consumption of the memory for performance analysis of the memory and may also provide a basis for system failure analysis.

At S410, the memory control command is received and the analog memory is controlled to enter different working stages according to the memory control command.

In the exemplary implementation mode of the disclosure, the analog memory is a memory model simulated according to components of the memory and the corresponding connection relationship of the components, for example, the memory structure may be established on simulation software based on the memory used actually, and various operations of the memory in the actual operation process may also be performed according to the memory control command. That is, the above analog memory may simulate the real memory to enter different working stages, so that various required data, such as current data, voltage data, etc. may be acquired.

In actual application, the memory has multiple control commands, such as a read operation command, a write operation command, a refresh operation command, etc. According to different control commands, the memory may enter different working stages to complete the corresponding operations.

In the exemplary implementation mode of the disclosure, the analog memory simulates the real memory to enter different working stages, so that the problem that it is difficult to record and acquire the current data or voltage data of the real memory in the working process may be solved.

At S420, the original current change curve of the analog memory in different working stages is acquired.

According to the memory control command, the analog memory is controlled to enter different working stages, such as the read operation stage, the write operation stage and the refresh operation stage. Generally, the above different working stages may be executed at intervals, so that the time at which the analog memory enters the different work stages needs to be marked. At the same time, in the marking process, the time lag between the issuance of the memory control command and the real execution start also needs to be considered, and the collected data is marked with the time of real execution start as a mark point, for example, so as to obtain the original current change curve.

The original current change curve may include change data of current corresponding to different working stages (including the read operation stage, the write operation stage and the refresh operation stage) over time. Based on these data, the subsequent determination of the memory power consumption may be performed.

At S430, the target time period corresponding to the target working stage is determined according to the time sequence of the memory control command.

In actual application, the memory control command is usually issued according to the time sequence of the memory control command According to the specific issuance time of the control command and the delay from issuing to executing the control command, the starting time point corresponding to the target working stage that needs to be acquired may be determined, and then the target time period of the target working stage may be determined according to the execution duration of the target working stage.

In the exemplary implementation mode of the disclosure, the target working stage may be at least one of different working stages, that is, the target working stage may only be the read operation stage, the write operation stage and the refresh operation stage. The target working stage may also be a read-write operation stage or a complete operation stage including read-write refresh. Alternatively, the target working stage may be at least one of four different sub-stages, i.e., Precharge, Access, Sense and Restore, in the read operation stage. The specific target working stage is not specially limited by the exemplary implementation mode of the disclosure, and may be flexibly determined according to actual needs.

At S440, the stage current change curve corresponding to the target working stage is intercepted from the original current change curve according to the target time period to obtain the target current change curve.

After the target time period is determined according to the operation at S430, the stage current change curve corresponding to the target time period, that is, the stage current change curve corresponding to the target working stage, may be intercepted from the original current change curve. For example, the stage current change curve corresponding to the target working stage may be the stage current change curve corresponding to the target read operation stage, the stage current change curve corresponding to the target write operation stage, etc.

In the exemplary implementation mode of the disclosure, after the stage current change curve corresponding to the target working stage is intercepted, the stage current change curve also needs to be processed to obtain the target current change curve.

The specific processing on the stage current change curve may be determined according to the required memory power consumption. If the required memory power consumption is the total power consumption, the total power consumption may be determined directly according to the current change curve in combination with the memory performance parameter.

In the exemplary implementation mode of the disclosure, taking the memory power consumption required to be determined as the average overrun power consumption of the memory for an example, the processing procedure of the intercepted stage current change curve is described in detail.

Figure 5:
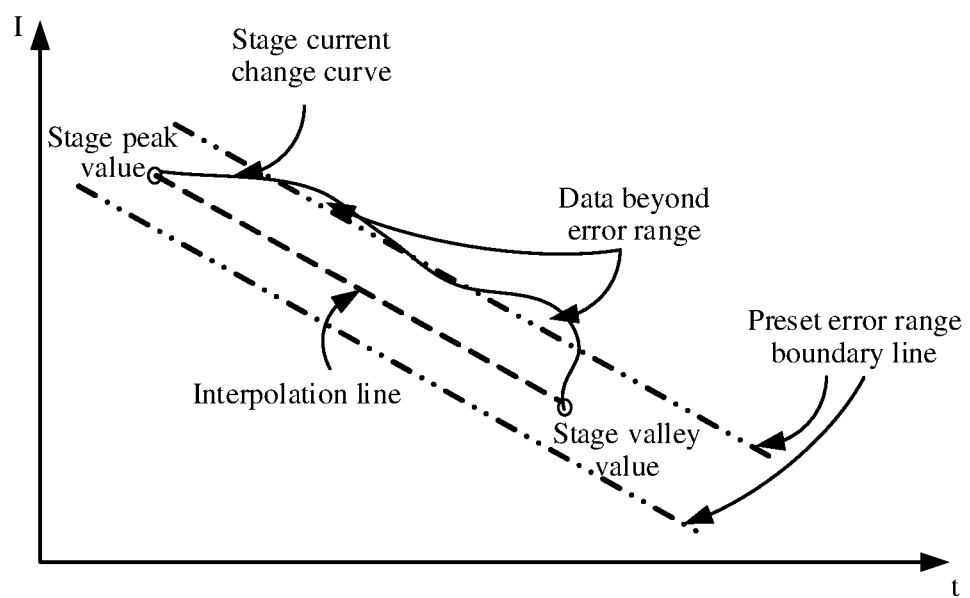
FIG. 5 schematically illustrates a schematic diagram of data processing of a stage current change curve according to an exemplary embodiment of the disclosure.

Referring to FIG. 5, after the stage current change curve corresponding to the target working stage is intercepted, the intercepted stage current change curve may be discretized according to a preset step length to obtain discrete data. Then, a stage peak value and a stage valley value are determined from the discrete data. The above stage peak value and the stage valley value are linearly interpolated to obtain an interpolation line. Then, the preset error range, for example, two preset error range boundary lines in FIG. 5, may be determined based on the interpolation line, one part of the stage current change curve falls within the preset error range and the other part falls outside the preset error range.

In actual application, the above preset error range may be determined according to the actual situation, for example, the preset error range is any value between 5%-15%. If the preset error range is 5%, as illustrated in FIG. 5, based on the interpolation line, the preset error range boundary lines may be determined at the positions +/−5% from the interpolation line on both sides of the interpolation line as the preset error range.

It is to be noted that the above process of determining the stage peak value and the stage valley value may also be performed before the stage current change curve is discretized, that is, the highest point is directly determined from the stage current change curve as the stage peak value and the lowest point is determined from the stage current change curve as the stage valley value. The accuracy of determining the stage peak value and stage valley value is improved, and the loss of the stage peak value and stage valley value in the discretization process is avoided.

In the exemplary implementation mode of the disclosure, the discrete data beyond the preset error range may be acquired and recorded as overrun data, and the overrun data, the stage peak value and the stage valley value may be fitted to obtain the target current change curve. The obtained target current change curve is mainly composed of data beyond the preset error range, so that the target current change curve may be configured to calculate the average overrun power consumption of the memory, and the average overrun power consumption of the memory may be used for performance analysis and failure analysis on the memory.

It is to be noted that in the process of determining the average overrun power consumption, the stage valley value may not be selected, but the overrun data and the stage peak value may be directly fitted to obtain the target current change curve. The exemplary implementation mode of the disclosure does not specifically limit the determination method of the target current change curve.

In actual application, the above preset step length may be determined according to the actual situation, for example, the preset step length may be any value between 8 ps and 12 ps, such as 10 ps. It is to be understood that the smaller the step length is, the higher the accuracy is and the longer the simulation time is, that is, the preset step length may be adjusted according to the required accuracy and time cost. The specific value of the preset step length is not specially limited by the exemplary implementation mode of the disclosure.

In some embodiments, preliminary data discretization may be performed according to a larger preset step firstly, for example, the intercepted stage current change curve is discretized according to the first preset step to obtain first discrete data. The first discrete data beyond the preset error range is acquired and recorded as first overrun data. Then, data discretization is further performed on the stage current change curve corresponding to the time period where the first overrun data is located according to a smaller second preset step to obtain second discrete data, and the second discrete data beyond the preset error range is acquired and recorded as second overrun data. Subsequently, the second overrun data, the stage peak value and the stage valley value are fitted to obtain the target current change curve. In this way, it is beneficial to dynamically balance the simulation time and simulation accuracy according to the actual waveform of the stage current change curve, and to shorten the simulation time and improve the simulation accuracy at the same time.

In actual application, the first preset step length is greater than the second preset step length. The values of the first preset step length and the second preset step length may be determined according to the actual situation, for example, the first preset step length may be greater than 12 ps, and the second preset step length may be less than or equal to 12 ps. The specific values of the first preset step length and the second preset step length are not specially limited by the exemplary implementation mode of the disclosure.

At S450 and S460, the target performance parameters are selected from the memory performance parameter table according to the target working stage; and the memory power consumption is determined according to the target performance parameters and the target current change curve.

In the exemplary implementation mode of the disclosure, after the target current change curve is determined, a target performance parameter needs to be selected from the memory performance parameter table according to the target working stage. If the target working stage is the read operation stage, the components in the memory involved in the read operation stage need to be acquired, and the target performance parameter may be determined from performance parameters of these components.

In actual application, the target performance parameters corresponding to different working stages are generally determined in advance according to the situation of the simulated real memory, and are stored in the memory performance parameter table for subsequent calling. The target performance parameters may include a resistance value, a capacitance value, an inductance value or the like corresponding to the target working stage.

After the target performance parameters are selected, the memory power consumption may be determined according to the target performance parameters in combination with the target current change curve. Specifically, in the process of determining the memory power consumption, the determined memory power consumption is different according to the different target current change curves.

If the target current change curve is the stage current change curve initially intercepted, the total power consumption of the memory in the target working stage may be calculated. If the target current change curve is composed of the above overrun data, the stage peak value and the stage valley value, the determined memory power consumption is the memory overrun power consumption and average overrun power consumption.

Taking determination of the average overrun power consumption of the memory as an example, the average overrun current in the target working stage may be determined according to the target current change curve determined in the above operation at S440. In the process of determining the average overrun current, the average overrun current may be obtained through dividing the area covered by the target current change curve by the covered time length. Finally, the average overrun power consumption of the memory may be determined according to the average overrun current, and the resistance value, the capacitance value and the inductance value corresponding to the target working stage. The specific determination process is not described here.

In the exemplary implementation mode of the disclosure, after the average overrun power consumption of the memory is determined, the memory may be adjusted according to the magnitude of the average overrun power consumption of the memory. For example, when the average overrun power consumption of the memory is greater than or equal to the preset power consumption, the power consumption analysis of the memory is performed to adjust the target performance parameters. For example, the resistance value, the capacitance value or the inductance value, etc. may be reduced, specifically, the resistance value may be reduced by selecting a component with a smaller resistance value, etc., and the operation frequency of the memory may be reduced, so as to ensure that the memory operates within a safe range. When the average overrun power consumption of the memory is less than the preset power consumption, an operating parameter of the target working stage in the memory may be adjusted, for example, increasing the operation frequency of the memory, so that the operation performance of the memory is improved under the condition of ensuring the normal operation of the memory.

In actual application, the preset power consumption may be the limit power consumption of the memory at the target working stage specified by the relevant standard of the memory, and may also be manually set according to the actual situation or determined by the stage peak value and the stage valley value, which are not specially limited by the exemplary implementation mode of the disclosure.

It is to be noted that after the target current change curve is determined, in addition to the above method for directly determining the memory power consumption, the data corresponding to the target current change curve may also be processed into a data format recognized by an analysis model. The processed data corresponding to the target current change curve may be input into the analysis model for system power consumption analysis to find out the possible power consumption problems of the memory. For example, whether the power consumption is caused by the memory itself or by noise, etc. The data analysis mode will not be elaborated in the exemplary implementation mode of the disclosure.

The method for determining the memory power consumption provided by the exemplary implementation modes of the disclosure may select the target current change curve corresponding to the target working stage according to different working stages, and then determine the possible average overrun power consumption of the memory according to the target current change curve. The target performance parameter or operating parameter of the memory may be adjusted based on the average overrun power consumption, so that the memory is adjusted to the optimal working state and the utilization of the memory is improved on the premise of meeting the actual needs.

It is to be noted that various operations of the method in the disclosure are described in the accompanying drawings in specific sequence. However, this does not require or imply that these operations must be executed in the particular order, or that all the operations illustrated must be executed to achieve desired results. Additionally or alternatively, certain operations may be omitted, a plurality of operations are combined into one operation for executing, and/or one operation is decomposed into the plurality of operations for executing, etc.

Figure 6:
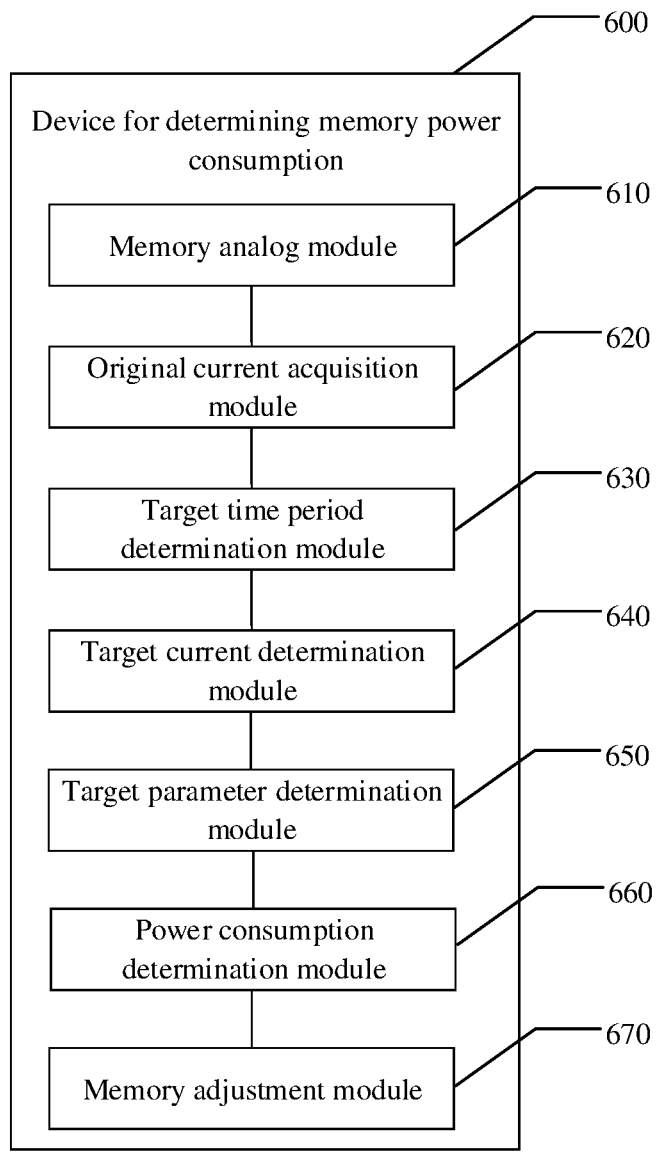
FIG. 6 schematically illustrates a block diagram of a device for determining memory power consumption according to an exemplary embodiment of the disclosure.

In addition, in the exemplary embodiment, a device for determining memory power consumption is also provided. Referring to FIG. 6, the device for determining memory power consumption 600 may include a memory analog module 610, an original current acquisition module 620, a target time period determination module 630, a target current determination module 640, a target parameter determination module 650, a power consumption determination module 660 and a memory adjustment module 670.

The memory analog module 610 may be configured to receive a memory control command and control an analog memory to enter different working stages according to the memory control command.

The original current acquisition module 620 may be configured to acquire an original current change curve of the analog memory in different working stages.

The target time period determination module 630 may be configured to determine a target time period corresponding to a target working stage according to a time sequence of the memory control command.

The target current determination module 640 may be configured to intercept a stage current change curve corresponding to the target working stage from the original current change curve according to the target time period to obtain a target current change curve.

The target parameter determination module 650 may be configured to select target performance parameters from a memory performance parameter table according to the target working stage.

The power consumption determination module 660 may be configured to determine the memory power consumption according to the target performance parameters and the target current change curve.

In an exemplary implementation mode of the disclosure, the target current determination module 640 may be configured to discretize the stage current change curve according to a preset step length to obtain discrete data, determine a stage peak value and a stage valley value from the discrete data, perform a linear interpolation on the stage peak value and the stage valley value to obtain an interpolation line, acquire and record the discrete data beyond a preset error range based on the interpolation line as the overrun data, and fit the overrun data, the stage peak value and the stage valley value to obtain the target current change curve.

In an exemplary implementation mode of the disclosure, the target current determination module 640 may also be configured to discretize the intercepted stage current change curve according to a first preset step length to obtain first discrete data, acquire and record the first discrete data beyond the preset error range as first overrun data, discretize the stage current change curve corresponding to the time period where the first overrun data is located according to a second preset step length to obtain second discrete data, acquire and record the second discrete data beyond the preset error range as second overrun data, and fit the second overrun data, the stage peak value and the stage valley value to obtain the target current change curve.

In an exemplary implementation mode of the disclosure, the first preset step length is greater than the second preset step length.

In an exemplary implementation mode of the disclosure, the power consumption determination module 660 may be configured to determine the average overrun current in the target working stage according to the target current change curve. The target performance parameters may include a resistance value, a capacitance value and an inductance value corresponding to the target working stage. The power consumption determination module 660 may be configured to determine an average overrun power consumption of the memory according to the average overrun current, the resistance value, the capacitance value and the inductance value.

In an exemplary implementation mode of the disclosure, the device for determining the memory power consumption may further include the memory adjustment module 670.

The memory adjustment module 670 may be configured to analyze the power consumption of the memory when the average overrun power consumption of the memory is greater than or equal to a preset power consumption to adjust the target performance parameters.

In an exemplary implementation mode of the disclosure, the memory adjustment module 670 may also be configured to adjust the operating parameter of the target working stage in the memory when the average overrun power consumption of the memory is less than the preset power consumption.

In an exemplary implementation mode of the disclosure, different working stages may include a read operation stage, a write operation stage and a refresh operation stage.

In an exemplary implementation mode of the disclosure, the target working stage may be at least one of the different working stages.

In an exemplary implementation mode of the disclosure, the preset error range is any value between 5% and 15%.

In an exemplary implementation mode of the disclosure, the analog memory is a memory model simulated according to components of the memory and the corresponding connection relationship of the components.

The specific details of a virtual module of each device for determining memory power consumption have been described in detail in the corresponding method for determining memory power consumption, so that it will not be elaborated here.

It is to be noted that, although a plurality of modules or units of the device for determining the memory power consumption are mentioned in the foregoing detailed descriptions, but this division is not mandatory. Actually, according to the implementation modes of the disclosure, the foregoing described features and functions of two or more modules or units may be embodied in a module or unit. Conversely, the foregoing described features and functions of a module or unit may further be embodied by a plurality of modules or units.

In the exemplary embodiment of the disclosure, an electronic device capable of implementing the above method is also provided.

Those skilled in the art may understand that various aspects of the disclosure may be implemented as systems, methods or program products. Therefore, various aspects of the disclosure may be specifically implemented in the following forms: a complete hardware implementation mode, a complete software implementation mode (including firmware, microcode, etc.), or a combination of hardware and software, which may be collectively referred to as "circuit", "module" or "system".

An electronic device 700 according to such implementation mode of the disclosure is described below with reference to FIG. 7. The electronic device 700 illustrated in FIG. 7 is only an example and should not form any limit to the functions and scope of application of the embodiments of the disclosure.

Figure 7:
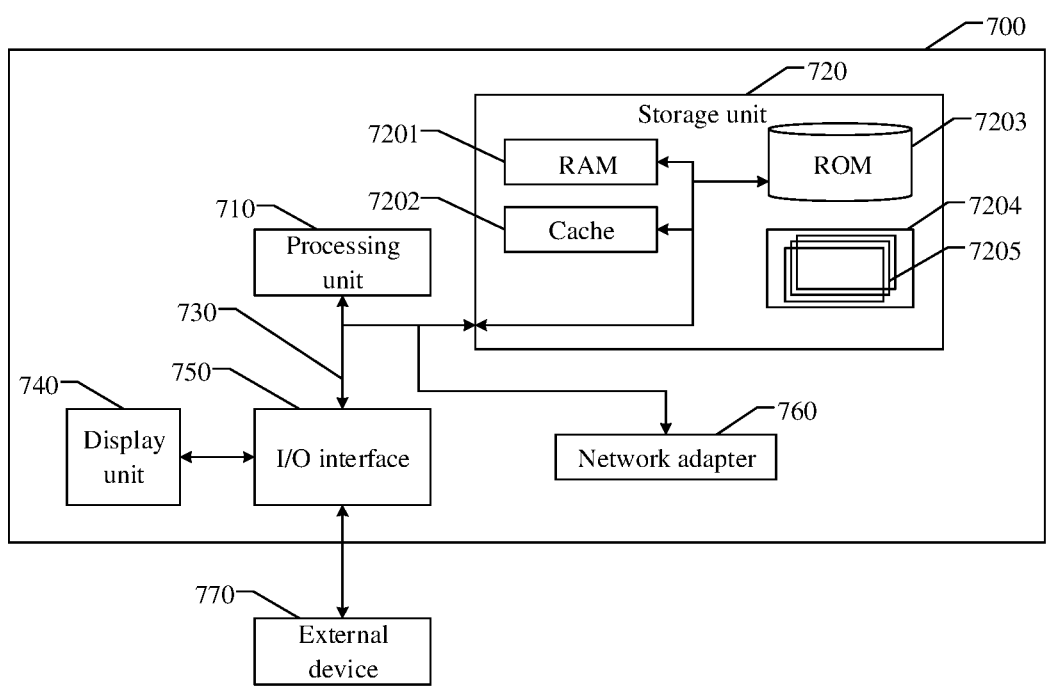
FIG. 7 schematically illustrates a module schematic diagram of an electronic device according to an exemplary embodiment of the disclosure.

As illustrated in FIG. 7, the electronic device 700 is represented in the form of a general computing device. The components of the electronic device 700 may include, but are not limited to, at least one processing unit 710, at least one storage unit 720, a bus 730 connecting different system components (including the storage unit 720 and the processing unit 710), and a display unit 740.

The storage unit 720 stores a program code that may be executed by the processing unit 710 to enable the processing unit 710 to execute the operations according to various exemplary implementation modes of the disclosure described in the above "exemplary methods" section of the description. For example, as illustrated in FIG. 4, the processing unit 710 may execute the following operations at S410 to S460. At S410, a memory control command is received and an analog memory is controlled to enter different working stages according to the memory control command. At S420, an original current change curve of the analog memory in different working stages is acquired. At S430, a target time period corresponding to a target working stage is determined according to the time sequence of the memory control command. At S440, a stage current change curve corresponding to the target working stage is intercepted from the original current change curve according to the target time period to obtain a target current change curve. At S450, target performance parameters are selected from a memory performance parameter table according to the target working stage. At S460, the memory power consumption is determined according to the target performance parameters and the target current change curve.

The storage unit 720 may include a readable medium in the form of a volatile storage unit, such as a Random Access Memory (RAM) 7201 and/or a cache storage unit 7202, and may further include a Read-Only Memory (ROM) 7203.

The storage unit 720 may also include a program/utility 7204 having a set (at least one) of program modules 7205. Such program modules 7205 includes, but are not limited to, an operating system, one or more application programs, other program modules and program data. Each or a certain combination of these examples may include an implementation of a network environment.

The bus 730 may represent one or more of several types of bus structures, including a storage unit bus or a storage unit controller, a peripheral bus, a graphics acceleration port, a processing unit, or a local bus using any of a variety of bus structures.

The electronic device 700 may also communicate with one or more external devices 770 (a keyboard, a pointing device, a Bluetooth device, etc.), with one or more devices that enable a user to interact with the electronic device 700, and/or with any device that enables the electronic device 700 to communicate with one or more other computing devices (a router, a modem, etc.). This communication may be performed through an input/output (I/O) interface 750. Moreover, the electronic device 700 may also communicate with one or more networks, such as a Local Area Network (LAN), a Wide Area Network (WAN), and/or a public network, such as the Internet, through a network adapter 760. As illustrated in FIG. 7, the network adapter 760 communicates with other modules of the electronic device 700 through the bus 730. It is to be understood that, although not illustrated in FIG. 7, other hardware and/or software modules may be used in combination with the electronic device 700, including, but not limited to, a microcode, a device driver, a redundant processing unit, an external disk drive array, a Redundant Arrays of Independent Disk (RAID) system, a tape drive, a data backup storage system, etc.

Through the above descriptions about the implementation modes, it is easily understood by those skilled in the art that the exemplary implementation modes described herein may be implemented by software, or may be implemented by combining the software and necessary hardware. Therefore, the technical solution according to the implementation modes of the disclosure may be embodied in form of a software product, and the software product may be stored in a non-volatile storage medium (which may be a CD-ROM, a U disk, a mobile hard disk, etc.) or a network, including a plurality of instructions enabling a computing device (which may be a personal computer, a server, a terminal device, a network device, etc.) to execute the method according to the implementation modes of the disclosure.

In the exemplary embodiment of the disclosure, a computer readable storage medium is also provided, on which a program product capable of achieving the above method in the description is stored. In some possible implementation modes, various aspects of the disclosure may also be implemented in the form of a program product including a program code. The program code, when being run on the terminal device, causes the terminal device to perform the operations according to various exemplary implementation modes of the disclosure described in the above "exemplary methods" section of the specification.

A program product for achieving the above method according to an implementation mode of the disclosure may adopt a portable Compact Disk Read Only Memory (CD-ROM) and include a program code, and may run on a terminal device, such as a personal computer. However, the program product of the disclosure is not limited to this. In the disclosure, the readable storage medium may be any tangible medium including or storing a program, and the program may be used by or in combination with an instruction execution system, device, or apparatus.

The program product may adopt any combination of one or more readable media. The readable medium may be a readable signal medium or a readable storage medium. The readable storage medium may be, but not limited to, for example, an electrical, magnetic, optical, electromagnetic, infrared, or semiconductor system, device, or apparatus, or any combination thereof. More specific examples (a non-exhaustive list) of the readable storage medium may include an electrical connector with one or more wires, a portable disk, a hard disk, a RAM, a ROM, an Erasable Programmable ROM (EPROM or a flash memory), an optical fiber, a CD-ROM, an optical storage device, a magnetic storage device, or any proper combination thereof.

The computer readable signal medium may include a data signal in a baseband or propagated as part of a carrier, a readable program code being born therein. A plurality of forms may be adopted for the propagated data signal, including, but not limited to, an electromagnetic signal, an optical signal, or any proper combination. The readable signal medium may also be any readable medium except the readable storage medium, and the readable medium may send, propagate, or transmit a program used by or in combination with an instruction execution system, device, or apparatus.

The program code in the readable medium may be transmitted with any proper medium, including, but not limited to, wireless, a wire, an optical cable, Radio Frequency (RF), or any proper combination thereof.

The program code for executing the operations of the disclosure may be written in any combination of one or more programming languages, including object-oriented programming languages such as Java, C++, etc., and conventional procedural programming languages such as "C" language or similar programming languages. The program code may be executed completely on a user computing device, partially on a user device, as a separate software package, partially on a user computing device, partially on a remote computing device, or completely on a remote computing device or server. In the case of the remote computing device, the remote computing device may be connected to a user computing device through any kind of network, including a LAN or a WAN, or may be connected to an external computing device (such as through the Internet using an Internet service provider).

Moreover, the drawings are merely schematic descriptions of processes included in the methods in the exemplary embodiments of the disclosure, but not for limitation. It should be easily understood that the processes illustrated in the above drawings do not indicate or limit the time sequence of these processes. Moreover, it is also to be easily understood that these processes may be executed synchronously or asynchronously in a plurality of modules.

After considering the specification and practicing the disclosure, those skilled in the art may easily conceive of other embodiments of this disclosure. This disclosure is intended to cover any variations, uses, or adaptive changes of this disclosure. These variations, uses, or adaptive changes follow the general principles of this disclosure and include common general knowledge or common technical means in the art, which are not disclosed in this disclosure. The specification and the embodiments are only considered as examples, and the practical scope and spirit of the disclosure are subject to the claims.

It should be understood that the disclosure is not limited to the precise structures described above and illustrated in the drawings, and various modifications and variations may be made without departing from the scope thereof. The scope of the disclosure is only subject to the appended claims.

The invention claimed is:

1. A method for determining memory power consumption of a memory, comprising:
receiving a memory control command and controlling an analog memory to enter different working stages according to the memory control command;
acquiring an original current change curve of the analog memory in different working stages;
determining a target time period corresponding to a target working stage according to a time sequence of the memory control command;
intercepting a stage current change curve corresponding to the target working stage from the original current change curve according to the target time period to obtain a target current change curve;
selecting target performance parameters from a memory performance parameter table according to the target working stage; and
determining the memory power consumption according to the target performance parameters and the target current change curve.

2. The method according to claim 1, wherein intercepting the stage current change curve corresponding to the target working stage from the original current change curve to obtain the target current change curve comprises:
discretizing the intercepted stage current change curve according to a preset step length to obtain discrete data;
determining a stage peak value and a stage valley value from the discrete data;
performing a linear interpolation on the stage peak value and the stage valley value to obtain an interpolation line;
acquiring the discrete data beyond a preset error range based on the interpolation line as overrun data; and
fitting the overrun data, the stage peak value and the stage valley value to obtain the target current change curve.

3. The method according to claim 2, wherein determining the memory power consumption according to the target performance parameters and the target current change curve comprises:
determining an average overrun current in the target working stage according to the target current change curve, the target performance parameters including a resistance value, a capacitance value and an inductance value corresponding to the target working stage; and determining an average overrun power consumption of the memory according to the average overrun current, the resistance value, the capacitance value and the inductance value.

4. The method according to claim 3, further comprising: analyzing the memory power consumption when the average overrun power consumption of the memory is greater than or equal to a preset power consumption to adjust the target performance parameters.

5. The method according to claim 3, further comprising: adjusting an operating parameter of the target working stage in the memory when the average overrun power consumption of the memory is less than a preset power consumption.

6. The method according to claim 2, wherein the preset error range is any value between 5% and 15%.

7. The method according to claim 1, wherein intercepting the stage current change curve corresponding to the target working stage from the original current change curve to obtain the target current change curve comprises:

discretizing the intercepted stage current change curve according to a first preset step length to obtain first discrete data;

acquiring the first discrete data beyond a preset error range as first overrun data;

discretizing the stage current change curve corresponding to a time period where the first overrun data is located according to a second preset step length to obtain second discrete data;

acquiring the second discrete data beyond the preset error range as second overrun data; and fitting the second overrun data, a stage peak value and a stage valley value to obtain the target current change curve.

8. The method according to claim 7, wherein the first preset step length is greater than the second preset step length.

9. The method according to claim 1, wherein the different working stages comprise a read operation stage, a write operation stage and a refresh operation stage.

10. The method according to claim 9, wherein the target working stage is at least one of the different working stages.

11. The method according to claim 1, wherein the analog memory is a memory model simulated according to components of the memory and a corresponding connection relationship of the components.

12. A device for determining memory power consumption of a memory, comprising:

a processor; and a memory, configured to store an executable instruction of the processor;

wherein the processor is configured to:

receive a memory control command and control an analog memory to enter different working stages according to the memory control command;

acquire an original current change curve of the analog memory in different working stages;

determine a target time period corresponding to a target working stage according to a time sequence of the memory control command;

intercept a stage current change curve corresponding to the target working stage from the original current change curve according to the target time period to obtain a target current change curve;

select target performance parameters from a memory performance parameter table according to the target working stage; and determine the memory power consumption according to the target performance parameters and the target current change curve.

13. The device according to claim 12, wherein the processor is configured to discretize the intercepted stage current change curve according to a preset step length to obtain discrete data, determine a stage peak value and a stage valley value from the discrete data, perform a linear interpolation on the stage peak value and the stage valley value to obtain an interpolation line, acquire the discrete data beyond a preset error range based on the interpolation line as overrun data, and fit the overrun data, the stage peak value and the stage valley value to obtain the target current change curve.

14. The device according to claim 13, wherein the processor is configured to determine an average overrun current in the target working stage according to the target current change curve, the target performance parameters comprising a resistance value, a capacitance value and an inductance value corresponding to the target working stage, and determine an average overrun power consumption of the memory according to the average overrun current, the resistance value, the capacitance value and the inductance value.

15. The device according to claim 14, wherein the processor is configured to analyze the memory power consumption when the average overrun power consumption of the memory is greater than or equal to a preset power consumption to adjust the target performance parameters.

16. The device according to claim 14, wherein the processor is further configured to adjust an operating parameter of the target working stage in the memory when the average overrun power consumption of the memory is less than a preset power consumption.

17. The device according to claim 12, wherein the processor is configured to discretize the intercepted stage current change curve according to a first preset step length to obtain first discrete data, acquire the first discrete data beyond a preset error range as first overrun data, discretize the stage current change curve corresponding to a time period where the first overrun data is located according to a second preset step length to obtain second discrete data, acquire the second discrete data beyond the preset error range as second overrun data, and fit the second overrun data, a stage peak value and a stage valley value to obtain the target current change curve.

18. The device according to claim 17, wherein the first preset step length is greater than the second preset step length.

19. The device according to claim 12, wherein the different working stages comprise a read operation stage, a write operation stage and a refresh operation stage.

20. A non-transitory computer readable storage medium, having stored a computer program thereon, wherein the computer program is executed by a processor to implement a method for determining memory power consumption of a memory, comprising:

receiving a memory control command and controlling an analog memory to enter different working stages according to the memory control command;

acquiring an original current change curve of the analog memory in different working stages;

determining a target time period corresponding to a target working stage according to a time sequence of the memory control command;

intercepting a stage current change curve corresponding to the target working stage from the original current change curve according to the target time period to obtain a target current change curve;

selecting target performance parameters from a memory performance parameter table according to the target working stage; and determining the memory power consumption according to the target performance parameters and the target current change curve.

* * * * *